(12) United States Patent
Lim

(10) Patent No.: US 10,999,916 B2
(45) Date of Patent: May 4, 2021

(54) FUNCTIONAL CONTACTOR FOR AN ELECTRONIC DEVICE

(71) Applicant: AMOTECH CO., LTD., Incheon (KR)

(72) Inventor: Byung Guk Lim, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 110 days.

(21) Appl. No.: 16/347,036

(22) PCT Filed: Nov. 2, 2017

(86) PCT No.: PCT/KR2017/012303
§ 371 (c)(1),
(2) Date: May 2, 2019

(87) PCT Pub. No.: WO2018/084587
PCT Pub. Date: May 11, 2018

(65) Prior Publication Data
US 2019/0281689 A1    Sep. 12, 2019

(30) Foreign Application Priority Data

Nov. 4, 2016 (KR) .................. 10-2016-0146488
Nov. 4, 2016 (KR) .................. 10-2016-0146490

(51) Int. Cl.
*H05F 3/02*    (2006.01)
*H05K 1/02*    (2006.01)
(Continued)

(52) U.S. Cl.
CPC .............. *H05F 3/02* (2013.01); *H01C 7/10* (2013.01); *H01C 7/12* (2013.01); *H01R 13/24* (2013.01);
(Continued)

(58) Field of Classification Search
CPC .... H05F 3/02; H01C 7/10; H01C 7/12; H01R 13/24; H01R 13/703; H01R 4/02;
(Continued)

(56) References Cited

U.S. PATENT DOCUMENTS 5,563,450 A * 10/1996 Bader ................ H01R 13/6485
257/785
6,538,197 B1    3/2003 Kawai
(Continued)

FOREIGN PATENT DOCUMENTS

KR    2016-0093563    8/1916
KR    2005-0028748    3/2005
(Continued)

OTHER PUBLICATIONS

International Search Report and Written Opinion issued in International Patent Application No. PCT/KR2017/012303, dated Mar. 6, 2018.
(Continued)

*Primary Examiner* — Yusef A Ahmed
(74) *Attorney, Agent, or Firm* — Norton Rose Fulbright US LLP

(57) ABSTRACT

A functional contactor is provided. The functional contactor contains a conductive elastic portion having elasticity and electrically contacting one of a circuit board of an electronic device, a bracket coupled to the circuit board, and a conductor which can come into contact with the human body; a substrate containing a plurality of dielectric layers; and a functional element embedded in the substrate so as to be electrically connected in series to the conductive elastic portion.

9 Claims, 5 Drawing Sheets

(51) Int. Cl.
- *H01C 7/12* (2006.01)
- *H04M 1/02* (2006.01)
- *H01R 13/24* (2006.01)
- *H01R 13/703* (2006.01)
- *H05K 9/00* (2006.01)
- *H01C 7/10* (2006.01)
- *H01R 4/02* (2006.01)

(52) U.S. Cl.
CPC ............ *H01R 13/703* (2013.01); *H04M 1/02* (2013.01); *H05K 1/0259* (2013.01); *H05K 9/00* (2013.01); *H01R 4/02* (2013.01); *H01R 2201/02* (2013.01)

(58) Field of Classification Search
CPC ... H01R 2201/02; H04M 1/02; H05K 1/0259; H02H 9/02; H02H 9/04
See application file for complete search history.

(56) References Cited

U.S. PATENT DOCUMENTS

| | | | | |
|---|---|---|---|---|
| 2006/0030179 | A1* | 2/2006 | Van Schuylenbergh | H01L 24/72 439/81 |
| 2006/0215342 | A1* | 9/2006 | Montoya | H01C 1/148 361/103 |
| 2006/0234466 | A1* | 10/2006 | Jeong | H01L 28/40 438/396 |
| 2007/0019346 | A1* | 1/2007 | Kim | H01C 7/12 361/56 |
| 2009/0035560 | A1* | 2/2009 | Block | H01C 17/06 428/336 |
| 2011/0287243 | A1* | 11/2011 | Carney | H05K 3/281 428/220 |
| 2012/0252233 | A1* | 10/2012 | Sano | H01R 12/716 439/65 |
| 2013/0122683 | A1* | 5/2013 | Malhotra | H01L 28/60 438/396 |
| 2013/0206315 | A1* | 8/2013 | Chung | H05K 9/0088 156/60 |
| 2014/0093722 | A1* | 4/2014 | Sung | H05K 9/0088 428/336 |
| 2014/0240878 | A1* | 8/2014 | Otsubo | H02H 9/04 361/56 |
| 2014/0376147 | A1* | 12/2014 | Tsukizawa | H01T 1/22 361/220 |
| 2016/0007510 | A1* | 1/2016 | Cheng | H05K 9/0088 428/551 |
| 2016/0149397 | A1* | 5/2016 | Kim | G06F 1/1656 307/326 |
| 2016/0149398 | A1* | 5/2016 | Kim | G06F 1/1656 307/326 |
| 2017/0005464 | A1* | 1/2017 | Hwang | H01C 7/12 |
| 2017/0077891 | A1* | 3/2017 | Kim | H05K 1/0231 |
| 2018/0007817 | A1* | 1/2018 | Ryu | G06F 1/1656 |
| 2018/0090123 | A1* | 3/2018 | Crotty | B32B 27/12 |
| 2018/0134920 | A1* | 5/2018 | Takami | B32B 15/092 |
| 2018/0190413 | A1* | 7/2018 | Lim | H05K 9/0015 |
| 2018/0324985 | A1* | 11/2018 | Ryu | H01T 4/02 |
| 2019/0097363 | A1* | 3/2019 | Cho | H05K 1/181 |
| 2019/0141825 | A1* | 5/2019 | Cho | H01C 7/10 |
| 2019/0190167 | A1* | 6/2019 | Choi | H01R 4/027 |

FOREIGN PATENT DOCUMENTS

| | | |
|---|---|---|
| KR | 2007-0109332 | 11/2007 |
| KR | 2008-0031183 | 4/2008 |
| KR | 2010-0011834 | 2/2010 |
| KR | 2010-0101225 | 9/2010 |
| KR | 2010-0139075 | 12/2010 |
| KR | 10-1334237 | 11/2013 |
| KR | 10-1585604 | 1/2016 |

OTHER PUBLICATIONS

International Search Report and Written Opinion issued in International Patent Application No. PCT/KR2017/012302, dated Mar. 7, 2018.

International Search Report and Written Opinion issued in International Patent Application No. PCT/KR2017/012456, dated Mar. 22, 2018.

\* cited by examiner

FUNCTIONAL CONTACTOR FOR AN ELECTRONIC DEVICE

CROSS-REFERENCE TO RELATED APPLICATIONS

This application is a national phase application under 35 U.S.C. § 371 of International Application No. PCT/KR2017/012303, filed Nov. 2, 2017, which claims priority to and the benefit of Korean Patent Applications No. 10-2016-0146488, filed Nov. 4, 2016, and No. 10-2016-0146490, filed Nov. 4, 2016. The contents of the referenced patent applications are incorporated into the present application by reference.

FIELD OF THE DISCLOSURE

The present invention relates to a contactor for an electronic device such as a smart phone, and more particularly, to a functional contactor which is capable of being easily manufactured and mass-produced using a large-area substrate.

BACKGROUND

In recent portable electronic devices, there is an increasing tendency to employ a metal housing so as to improve an aesthetic impression and robustness. The portable electronic device employs a conductive elastic portion, such as a conductive gasket or a conductive clip, between an external housing and an internal circuit substrate of the portable electronic device for alleviating impact from the outside and, simultaneously, reducing electromagnetic waves penetrating into the portable electronic devices or being leaked therefrom, and for an electrical contact between an antenna disposed in the external housing and the internal circuit substrate.

However, since an electrical path between the external housing and the internal circuit substrate may be formed due to the conductive elastic portion, when static electricity having high voltage instantaneously flows through a conductor such as an external metal housing, the static electricity can flow into the internal circuit substrate through the elastic portion to damage an integrated circuit (IC) and the like, and a leakage current generated by an alternating current (AC) power source flows to the external housing along a ground of a circuit so that a user is uncomfortable, and, in the worst case, the leakage current results in electric shock which may cause injury to the user.

A protective element for protecting the user from the static electricity or the leakage current is provided together with a conductive elastic portion connecting the metal housing and the circuit substrate. As a conductor such as a metal case is used, it is required for a functional contactor which has various functions for not only a simple electrical contact but also for protecting a user or a circuit in a portable electronic device or smoothly transferring a communication signal.

Meanwhile, during a process of bonding the conductive elastic portion to the protective element by soldering, since the conductive elastic portion and the protective element are individually bonded, it is difficult to mass produce the conventional functional contactor. In particular, since both of the conductive elastic portion and the protective element have a small size, a great deal of time and effort are put into a precise bonding between the conductive elastic portion and the protective element and manufacturing efficiency is reduced such that there is a pressing need for improvement of bonding the conductive elastic portion to the protective element.

SUMMARY OF THE INVENTION

The present invention is directed to providing a functional contactor which is suitable for mass production and capable of improving efficiency of a manufacturing process by embedding a functional element in a substrate or implementing a functional element in a form of being embedded in a substrate using a large-area substrate.

Further, the present invention is directed to providing a functional contactor which is capable of improving reliability of a product by not exposing a bonded portion between a substrate and a functional element to the outside and protecting the bonded portion from external impact.

Further, the present invention is directed to providing a functional contactor which is capable of being mass-produced by implementing a functional element in a stacked substrate and performing a soldering process using a large-area substrate.

One aspect of the present invention provides a functional contactor including a conductive elastic portion configured to come into electrical contact with one among a circuit substrate of an electronic device, a bracket coupled to the circuit substrate, and a conductor contactable with a human body and having elasticity, a substrate comprised of a plurality of dielectric layers, and a functional element embedded in the substrate to be electrically connected in series to the conductive elastic portion.

The substrate may include a first outer electrode provided below the plurality of dielectric layers, a second outer electrode provided on the plurality of dielectric layers and connected to the conductive elastic portion, a first connection electrode connected to the first outer electrode through a first conductive via, a second connection electrode connected to the second outer electrode through a second conductive via, and a cavity in which the functional element is embedded.

Outer electrodes may be provided at both ends of the functional element and connected to the first connection electrode and the second connection electrode on both sides of the cavity.

Outer electrodes may be provided on and below the functional element and connected to the first connection electrode and the second connection electrode at an upper end and a lower end of the cavity.

Another aspect of the present invention provides a functional contactor including a conductive elastic portion configured to come into electrical contact with one among a circuit substrate of an electronic device, a bracket coupled to the circuit substrate, and a conductor contactable with a human body and having elasticity, a substrate comprised of a plurality of dielectric layers, and a functional element including a first electrode embedded in the substrate so as to be electrically connected in series to the conductive elastic portion, and a second electrode embedded in the substrate to be opposite to the first electrode.

Each of the plurality of dielectric layers may be made of frame retardant 4 (FR4) or polyimide (PI).

The plurality of dielectric layers may include a first dielectric layer disposed between the first electrode and the second electrode, and a plurality of second dielectric layers disposed on the first electrode and below the second electrode.

The first dielectric layer may have a dielectric constant that is higher than that of each the plurality of second dielectric layers.

The substrate may include a first outer electrode provided on the plurality of sheet layers, a second outer electrode provided below the plurality of sheet layers and connected to the conductive elastic portion, a first conductive via configured to connect the first outer electrode to the first electrode, and a second conductive via configured to connect the second outer electrode to the second electrode.

The functional element may further include a pore formed between the first electrode and the second electrode.

An electrical discharge material layer may be formed on a part or an entirety of the pore.

The functional element may have at least one among an electric shock prevention function of blocking a leakage current of an external power source flowing from a ground of a circuit substrate of the electronic device, a communication signal transfer function of passing a communication signal flowed from a conductive case or the circuit substrate, and an electrostatic discharge (ESD) protection function of passing an ESD without a dielectric breakdown when the ESD flows from the conductive case.

The conductive elastic portion may include one among a conductive gasket, a silicone rubber pad, and a clip-shaped conductor having elasticity.

The conductive elastic portion may be in line contact or in point contact so as to reduce galvanic corrosion.

In accordance with the present invention, a conductive elastic portion is stacked on and bonded to a substrate having a functional element embedded therein so that a functional contactor is suitable for mass production and efficiency of a manufacturing process can be improved such that a manufacturing cost and a process time can be reduced.

Further, in accordance with the present invention, since the functional element is embedded in the substrate, external exposure of the bonded portion can be avoided to protect the bonded portion from external impact such that reliability of a product can be improved.

Further, in accordance with the present invention, a plurality of functional elements are embedded in a large-area substrate, a plurality of conductive elastic portions are soldered, and then the large-area substrate is cut in a unit size so that an alignment and soldering of the conductive elastic portions can be easily performed such that the efficiency of the manufacturing process and the reliability of the product can be further improved.

Moreover, in accordance with the present invention, the plurality of conductive elastic portions are bonded to the large-area substrate having the plurality of functional elements embedded therein through soldering such that the plurality of conductive elastic portions can be easily aligned on and stably bonded to the large-area substrate such that the reliability of the product can be improved.

DETAILED DESCRIPTION OF THE INVENTION

Figure 1:
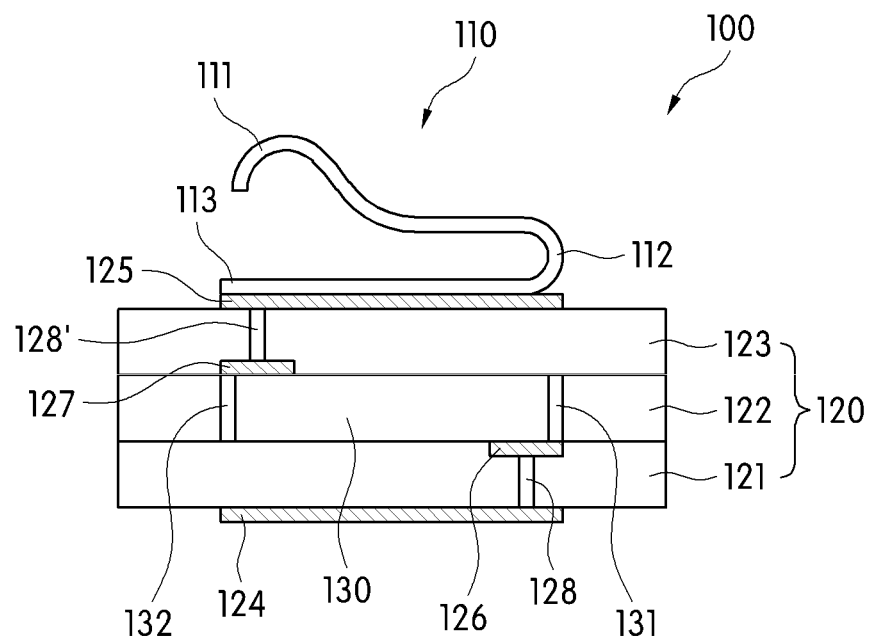
FIG. 1 is a cross-sectional view of an example of a functional contactor according to a first embodiment of the present invention.

Hereinafter, embodiments of the present invention will be fully described in detail which is suitable for easy implementation by those skilled in the art to which the present invention pertains with reference to the accompanying drawings. The present invention may be implemented in various different forms, and thus it is not limited to embodiments which will be described herein. In the drawings, some portions not related to the description will be omitted in order to clearly describe the present invention, and the same or similar reference numerals are given to the same or similar components throughout this disclosure.

Figure 2:
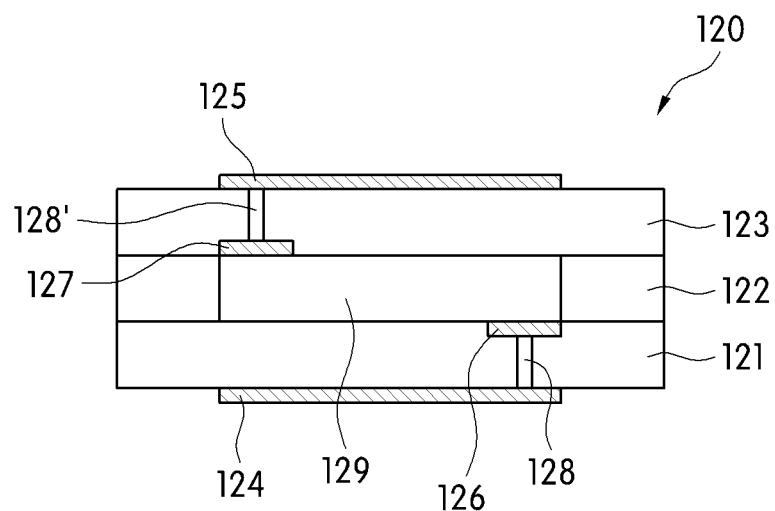
FIG. 2 is a cross-sectional view of a substrate of FIG. 1.

As shown in FIGS. 1 and 2, a functional contactor 100 according to a first embodiment of the present invention includes a conductive elastic portion 110, a substrate 120, and a functional element 130.

In a portable electronic device, the functional contactor 100 is configured to electrically connect a conductive case such as an external metal case to a circuit substrate or to electrically connect the conductive case to a conductive bracket electrically coupled to one side of the circuit substrate.

That is, in the functional contactor 100, the conductive elastic portion 110 may come into contact with the circuit substrate or the conductive bracket and the substrate 120 may be coupled to the conductive case. Contrarily, the conductive elastic portion 110 may come into contact with the conductive case and the substrate 120 may be coupled to the circuit substrate.

For example, when the functional contactor 100 is a functional contactor of a surface mount technology (SMT) type, i.e., the functional contactor 100 is coupled through soldering, the substrate 120 may be bonded to the circuit substrate of the portable electronic device, and when the functional contactor 100 is a functional contactor of an adhesive layer type, i.e., the functional contactor 100 is coupled through a conductive adhesive layer, the substrate 120 may be coupled to the conductive case.

Meanwhile, the portable electronic device may be formed as a portable electronic device which is portable and easy to carry. For example, the portable electronic device may be a portable terminal such as a smart phone, a cellular phone, or the like and may be a smart watch, a digital camera, a digital multimedia broadcasting (DMB), an electronic book, a netbook, a tablet personal computer (PC), a portable computer, or the like. The electronic device may have any suitable electronic components including antenna structures for communicating with external devices. Further, the electronic device may be a device using a local area network communication such as Wi-Fi or Bluetooth.

Here, the conductive case may be an antenna for communication between the portable electronic device and an external device. For example, the conductive case may be provided to partially or entirely surround a side portion of the portable electronic device.

The conductive elastic portion 110 comes into electrical contact with any one among the circuit substrate of the electronic device, the bracket coupled to the circuit substrate, and a conductor contactable with a human body and has elasticity.

In FIG. 1, although the conductive elastic portion 110 has been shown and described as being a clip-shaped conductor having elasticity, the present invention is not limited thereto, and the conductive elastic portion 110 may be a conductive gasket or a silicone rubber pad.

Here, when the conductive elastic portion 110 comes into contact with the circuit substrate, the conductive bracket, and the conductor, the conductive elastic portion 110 may be contracted to the substrate 120 due to a pressing force, and when the conductive case is separated from the portable electronic device, the conductive elastic portion 110 may be restored to its original state due to elasticity.

Meanwhile, when the conductive elastic portion 110 is pressurized, galvanic corrosion occurs due to a potential difference between dissimilar metals. In this case, in order to minimize galvanic corrosion, the conductive elastic portion 110 may be formed to have a small contact area.

That is, the conductive elastic portion 110 may be configured not only to be in surface contact but also, preferably, to be in line contact and/or point contact. For example, when the conductive elastic portion 110 is the conductive gasket or the silicone rubber pad, the conductive elastic portion 110 may be in surface contact, whereas, when the conductive elastic portion 110 is the clip-shaped conductor, the conductive elastic portion 110 may be in line contact and/or point contact.

For example, when the conductive elastic portion 110 is the clip-shaped conductor, the clip-shaped conductor includes a contact portion 111, a bent portion 112, and a terminal 113.

Here, the clip-shaped conductor may be a C-shaped clip which is substantially "C" shaped. Since the clip-shaped conductor 110 is in line contact or point contact, galvanic corrosion resistance may be excellent.

The contact portion 111 may have a curved shape and come into electrical contact with the conductive case and either the circuit substrate or the conductive bracket. The bent portion 112 may be formed to extend from the contact portion 111 and may have elasticity. The terminal 113 may be a terminal electrically connected to the substrate 120.

The contact portion 111, the bent portion 112, and the terminal 113 may be integrally formed of a conductive material having elasticity.

The substrate 120 is comprised of a plurality of dielectric layers 121, 122, and 123. For example, the substrate 120 may be comprised of three dielectric layers 121, 122, and 123. That is, the three dielectric layers 121, 122, and 123 are sequentially stacked. The first dielectric layer 121 may be disposed at a lowermost portion of the substrate 120, the second dielectric layer 122 may be disposed on the first dielectric layer 121, and the third dielectric layer 123 may be disposed on the second dielectric layer 122. Here, the plurality of dielectric layers 121 to 123 may each be made of flame retardant 4 (FR4) or polyimide (PI).

The substrate 120 may have an internal pattern so as to electrically connect the functional element 130 to the conductive elastic portion 110 in series.

For example, the substrate 120 may include a first outer electrode 124, a second outer electrode 125, a first connection electrode 126, a second connection electrode 127, a first conductive via 128, a second conductive via 128', and a cavity 129.

The first outer electrode 124 may be provided below the first dielectric layer 121 to be coupled to the circuit substrate of the portable electronic device through soldering or to be coupled to the conductive case through a conductive adhesive layer. In this case, although the first outer electrode 124 has been shown and described as being provided on a portion of a lower surface of the first dielectric layer 121, the present invention is not limited thereto, and the first outer electrode 124 may be provided on an entirety of the lower surface of the first dielectric layer 121.

The second outer electrode 125 is provided on the third dielectric layer 123 to be connected to the conductive elastic portion 110. Here, the second outer electrode 125 may be coupled to the conductive elastic portion 110 using solder (not shown). In this case, although the second outer electrode 125 has been shown and described as being provided on a portion of an upper surface of the third dielectric layer 123, the present invention is not limited thereto, and the second outer electrode 125 may be provided on an entirety of the upper surface of the third dielectric layer 123.

The first connector electrode 126 may be provided below the second dielectric layer 122 and formed to be exposed on a lower surface of the cavity 129. The first connection electrode 126 may be connected to an outer electrode 131 of the functional element 130 through soldering.

The second connection electrode 127 may be provided on the second dielectric layer 122 and formed to be exposed to the cavity 129. The second connection electrode 127 may be connected to an outer electrode 132 of the functional element 130 through soldering.

The first conductive via 128 may be vertically formed to pass through the first dielectric layer 121 to connect the first outer electrode 124 and the first connection electrode 126. The first conductive via 128 may be formed by forming a via hole in the first dielectric layer 121 and filling the formed via hole with a conductive material.

The second conductive via 128' may be vertically formed to pass through the third dielectric layer 123 to connect the second outer electrode 125 and the second connection electrode 127. The second conductive via 128' may be formed by forming a via hole in the third dielectric layer 123 and filling the formed via hole with a conductive material.

As shown in FIG. 2, the cavity 129 may be provided in the second dielectric layer 122 so that the functional element 130 may be embedded in the cavity 129. The cavity 129 may be vertically formed to pass through the second dielectric layer 122. The cavity 129 may be formed at a substantial center of the second dielectric layer 122.

Meanwhile, the substrate 120 may serve as a guide as a medium for fixing the conductive elastic portion 110 and the functional element 130 and coupling the conductive elastic portion 110 and the functional element 130 to the conductive case. That is, when the conductive elastic portion 110 is bonded to the functional element 130, even though soldering is difficult, the substrate 120 may provide stable bonding through the conductive adhesive layer or the like.

The functional element 130 is embedded in the substrate 120 to be electrically connected in series to the conductive elastic portion 110. That is, the functional element 130 may be embedded in the cavity 129 of the substrate 120 to be electrically connected in series to the conductive elastic portion 110 through the second connection electrode 127, the second conductive via 128', and the second outer electrode 125.

As described above, since the functional element 130 is embedded in the substrate 120 and thus a bonded portion of the functional element 130 is not exposed to the outside, the bonded portion may be protected from external impact so that the functional element 130 may maintain the electrical connection to the conductive elastic portion 110 and the substrate 120 without being separated therefrom such that reliability of a product may be improved.

The outer electrodes 131 and 132 may be provided at both ends of the functional element 130. That is, the functional element 130 may be embedded in the cavity 129 of the substrate 120 to be connected to the first connection electrode 126 on a right side of the cavity 129 and to be connected to the second connection electrode 127 on a left side of the cavity 129.

Here, the functional element 130 may have a function of protecting a user or an internal circuit. For example, the functional element 130 may include at least one among an electric shock protection element, a varistor, a suppressor, a diode, and a capacitor.

That is, the functional element 130 may block a leakage current of an external power source flowing from a ground of a circuit substrate of an electronic device. In this case, the functional element 130 may be configured to have a breakdown voltage Vbr or a withstanding voltage that is higher than a rated voltage of the external power source of the electronic device. Here, the rated voltage may be a standard rated voltage for each country. For example, the rated voltage may be any one among 240 V, 110 V, 220 V, 120 V, and 100 V.

Further, when the conductive case has a function of an antenna, the functional element 130 may serve as a capacitor to block the leakage current of the external power source and to pass a communication signal flowed from the conductor or the circuit substrate.

Further, the functional element 130 may pass an electrostatic discharge (ESD) flowing from the conductive case without a dielectric breakdown. In this case, the functional element 130 may be configured to have a breakdown voltage Vbr that is lower than a dielectric breakdown voltage Vcp of a sintered body.

Accordingly, the functional contactor 100 may electrically connect the conductive case to the circuit substrate to allow the communication signal, the ESD, and the like to be passed, but the functional contactor 100 may block the leakage current of the external power source from the circuit substrate from flowing to the conductive case.

Meanwhile, in the functional contactor according to the first embodiment of the present invention, the functional element may be variously modified.

Figure 3:
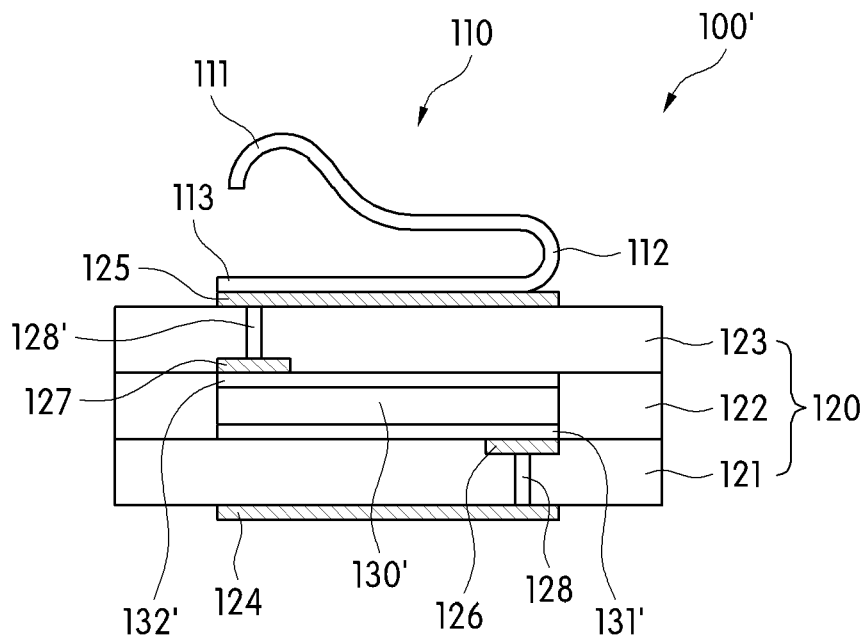
FIG. 3 is a cross-sectional view of another example of the functional contactor according to the first embodiment of the present invention.

As shown in FIG. 3, outer electrodes 131' and 132' may be respectively provided below and on a functional element 130'. That is, in the functional contactor 100', the functional element 130' may be embedded in the cavity 129 of the substrate 120 to be connected to the first connection electrode 126 on the cavity 129 and connected to the second connection electrode 127 below the cavity 129.

The functional contactor 100 or 100' may be manufactured using a large-area substrate. For example, the functional contactor 100 or 100' may be formed such that a plurality of functional elements 130 or 130' are embedded in a large-area substrate 120a having a plurality of cavities 129, a plurality of conductive elastic portions 110 are soldered to the large-area substrate 120a, and then the large-area substrate 120a is cut in a unit size.

The manufacturing process of the functional contactor 100 or 100' will be described in more detail with reference to FIGS. 4 to 6.

Figure 4:
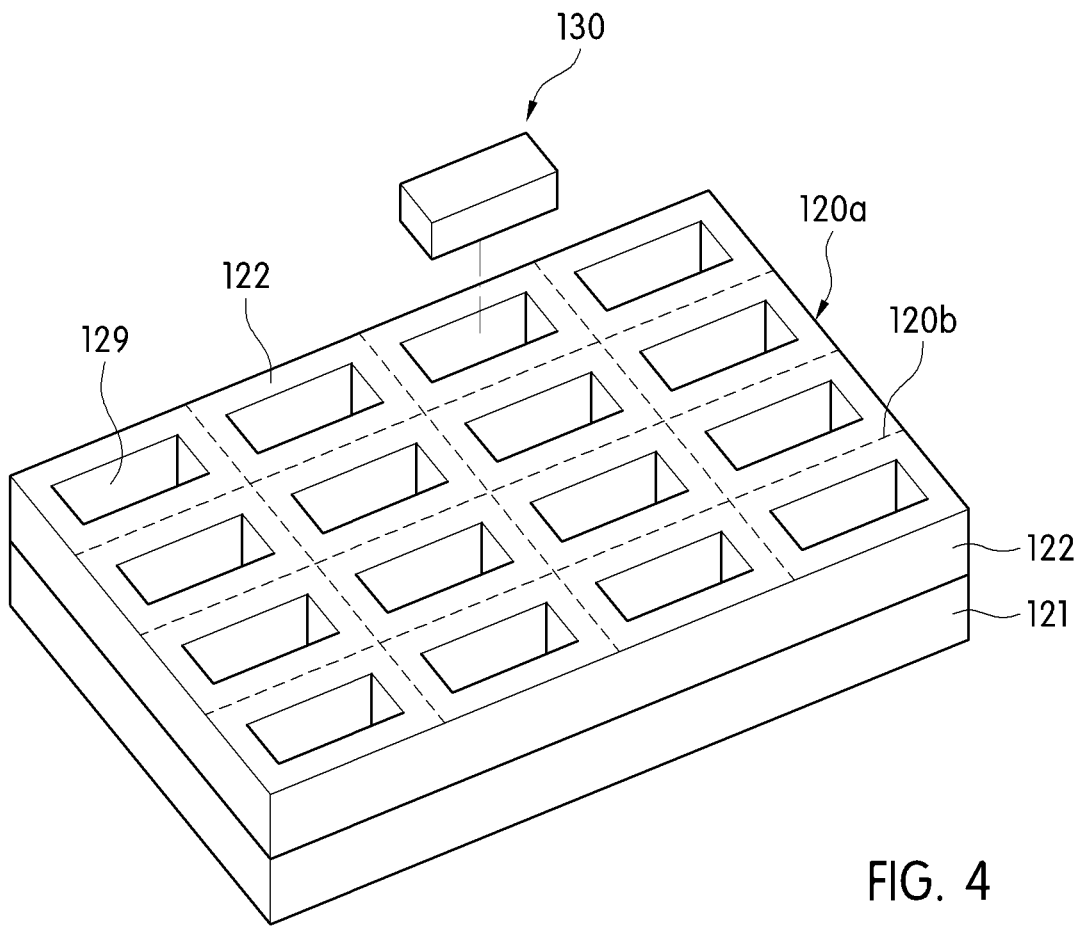
FIG. 4 is a perspective view illustrating a process of embedding functional elements in a substrate during a process of manufacturing the functional contactor according to the first embodiment of the present invention.

As shown in FIG. 4, a plurality of cavities 129 are formed on the large-area substrate 120a first. Here, the large-area substrate 120a may be formed of only the first dielectric layer 121 and the second dielectric layer 122. That is, in order to mass-produce the functional contactor 100 or 100', the second dielectric layer 122 is stacked on the first dielectric layer 121. In this case, as shown in FIG. 5, the first outer electrode 124, the first connection electrode 126, and the first conductive via 128 may be provided on and in the first dielectric layer 121, and the cavity 129 may be provided at a central portion of the second dielectric layer 122.

As described above, a plurality of functional elements 130 may be embedded in the plurality of formed cavities 129. In this case, the plurality of functional elements 130 may be embedded in the plurality of cavities 129 through soldering.

Figure 5:
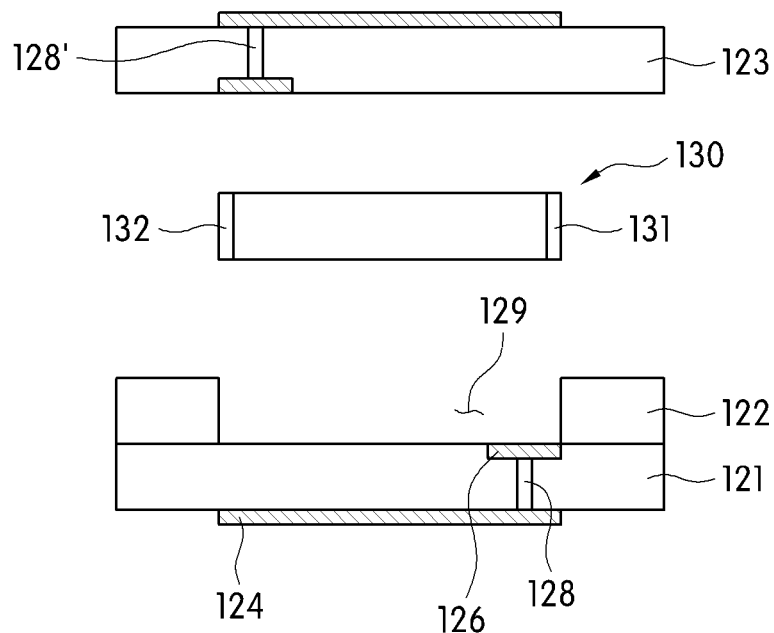
FIG. 5 is a cross-sectional view illustrating a process of embedding a functional element in a substrate during the process of manufacturing the functional contactor according to the first embodiment of the present invention.

As shown in FIG. 5, a large-area third dielectric layer 123 is disposed on the second dielectric layer 122 in which the functional elements 130 are embedded so that the functional elements 130 may be embedded in the substrate 120. In this case, the second outer electrode 125, the second connection electrode 127, and the second conductive via 128' may be provided on and in the third dielectric layer 123.

As described above, the functional element 130 is embedded in the substrate 120 using the large-area substrate 120a such that mass production may be possible. Further, since the functional element 130 is embedded in the cavity 129 of the substrate 120, a position alignment may be easily performed and accuracy thereof may be increased as compared with a case in which the functional element 130 is coupled to a guide.

Figure 6:
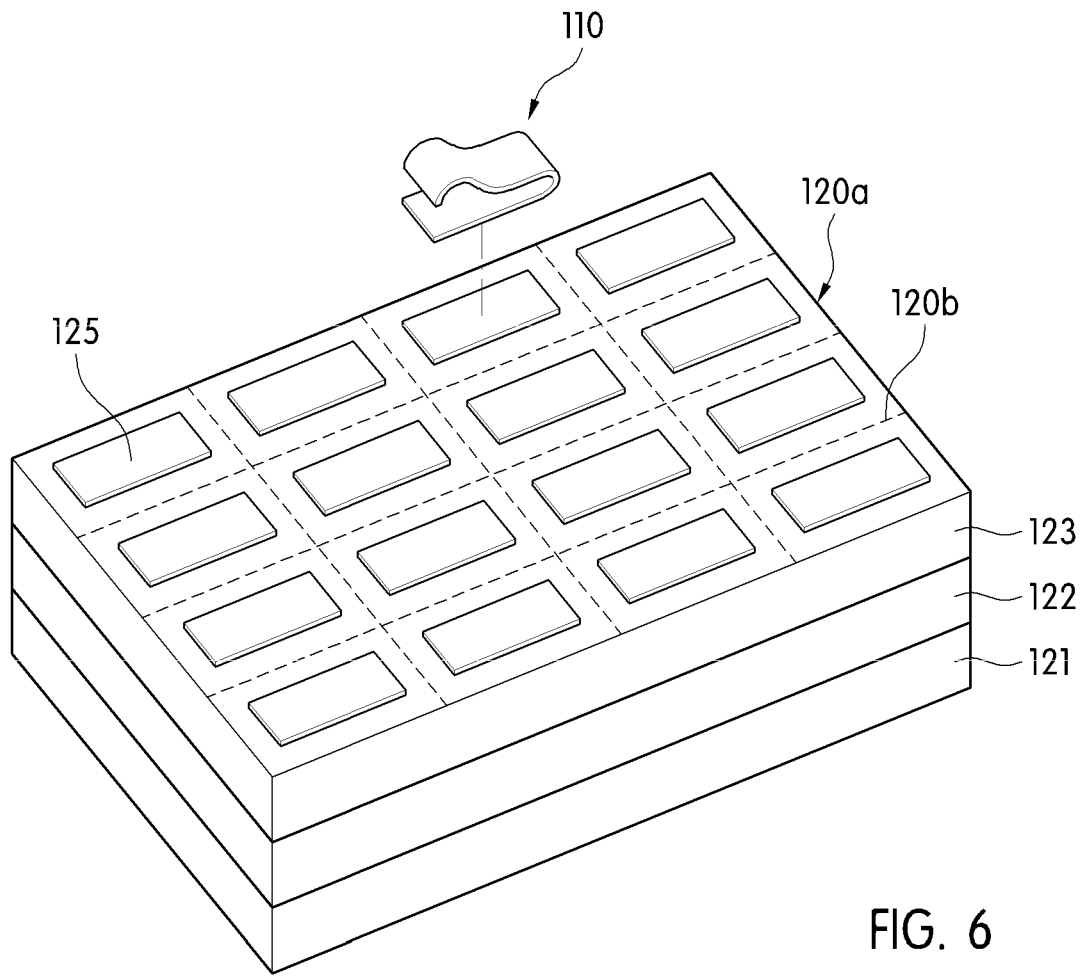
FIG. 6 is a perspective view illustrating a process of soldering a conductive elastic portions during the process of manufacturing the functional contactor according to the first embodiment of the present invention.

As shown in FIG. 6, conductive elastic portions 110 may be bonded to the large-area substrate 120a comprised of the plurality of dielectric layers 121, 122, and 123 and having the functional elements 130 embedded therein through soldering.

That is, in a state in which second outer electrodes 125 are exposed to the outside on an upper surface of the large-area substrate 120a having the functional elements 130 embedded therein, the plurality of conductive elastic portions 110 are soldered to the first electrodes 125 using solder such that the conductive elastic portion 110, the substrate 120, and the functional element 130 may be integrally formed.

As described above, since the plurality of conductive elastic portions 110 are soldered to the plurality of first electrodes 125 on the large-area substrate 120a using solder, an alignment and soldering of the conductive elastic portions 110 may be performed easily and accurately as compared with a conventional individual coupling such that efficiency of a manufacturing process as well as reliability of a product may be improved.

In this case, the large-area substrate 120a is cut along a cutting line 120b having a unit size such that a unit functional contactor 100 or 100' may be manufactured in large quantities.

As described above, since the embedding of the plurality of functional elements 130 and the soldering of the conductive elastic portions 110 may be carried out simultaneously in large quantities using the large-area substrate 120a, mass production of the functional contactor 100 may be possible.

Meanwhile, according to the present invention, a functional element may be implemented using a substrate.

Figure 7:
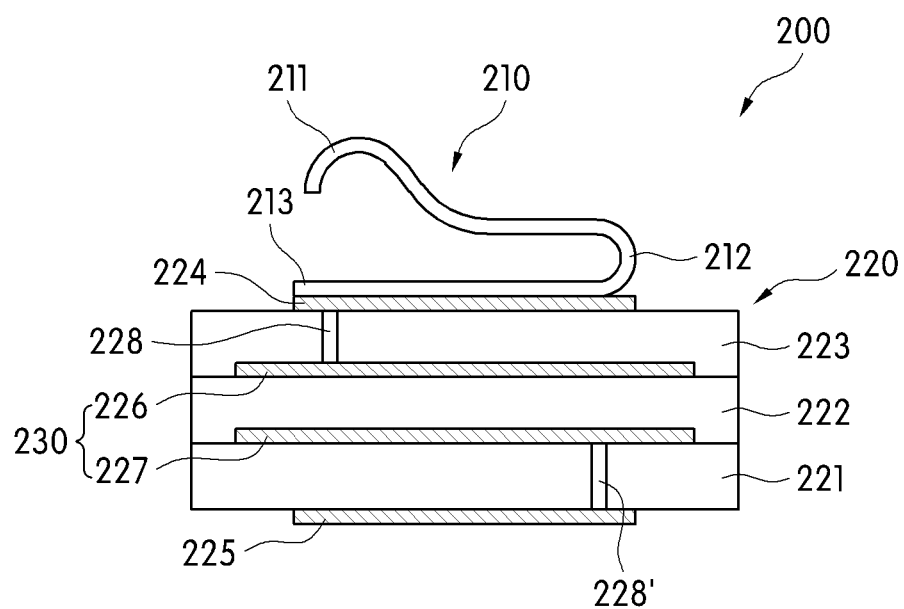
FIG. 7 is a cross-sectional view of an example of a functional contactor according to a second embodiment of the present invention.

As shown in FIG. 7, a functional contactor 200 according to a second embodiment of the present invention includes a conductive elastic portion 210, a substrate 220, and a functional element 230.

A configuration of the conductive elastic portion 210 is identical to that of the conductive elastic portion 110 of the first embodiment, and thus a detailed description thereof will be omitted.

The substrate 220 is comprised of a plurality of dielectric layers 221, 222, and 223. For example, the substrate 220 may be comprised of three dielectric layers 221, 222, and 223. That is, the three dielectric layers 221, 222, and 223 are sequentially stacked. The dielectric layer 221 may be disposed at a lowermost portion of the substrate 220, the dielectric layer 222 may be disposed on the dielectric layer 221, and the dielectric layer 223 may be disposed on the dielectric layer 222. Here, the plurality of dielectric layers 221, 222, and 223 may each be made of FR4 or PI.

Alternatively, the plurality of dielectric layers 221, 222, and 223 may be made of materials having different dielectric constants. Here, the plurality of dielectric layers 221, 222, and 223 include a first dielectric layer 221 disposed between a first electrode 226 and a second electrode 227, and a plurality of second dielectric layers 221 and 223 disposed below the second electrode 227 and above the first electrode 226, respectively. The first dielectric layer 222 may have a dielectric constant that is higher than that of each of the plurality of second dielectric layers 221 and 223.

For example, the first dielectric layer 222 may be made of FR4, and the second dielectric layers 221 and 223 may each be formed of PI. Here, as described below, the first dielectric layer 222 forms a part of the functional element 230.

The substrate 220 may have an internal pattern so as to electrically connect the functional element 230 to the conductive elastic portion 210 in series. For example, the substrate 220 may include a first outer electrode 224, a second outer electrode 225, a first conductive via 228, and a second conductive via 228'.

The first outer electrode 224 is provided on the dielectric layer 223 to be connected to the conductive elastic portion 210. Here, the first outer electrode 224 may be coupled to the conductive elastic portion 210 using solder (not shown). In this case, although the first outer electrode 224 has been shown and described as being provided on a portion of an upper surface of the dielectric layer 223, the present invention is not limited thereto, and the first outer electrode 224 may be provided on an entirety of the upper surface of the dielectric layer 223.

The second outer electrode 225 may be provided below the dielectric layer 221 to be coupled to the circuit substrate of the portable electronic device through soldering or coupled to the conductive case through a conductive adhesive layer. In this case, although the second outer electrode 225 has been shown and described as being provided on a portion of a lower surface of the dielectric layer 221, the present invention is not limited thereto, and the second outer electrode 225 may be provided on an entirety of the lower surface of the dielectric layer 221.

The first conductive via 228 may be vertically formed to pass through the dielectric layer 221 to connect the first outer electrode 224 and the first electrode 226. The first conductive via 228 may be formed such that a via hole is formed in the dielectric layer 221 and the formed via hole is filled with a conductive material.

The second conductive via 228' may be vertically formed to pass through the dielectric layer 223 to connect the second outer electrode 225 and the second electrode 227. The second conductive via 228' may be formed such that a via hole is formed in the dielectric layer 223 and the formed via hole is filled with a conductive material.

Meanwhile, the substrate 220 may serve as a guide as a medium for fixing the conductive elastic portion 210 and the functional element 230 and coupling the conductive elastic portion 210 and the functional element 230 to the conductive case. That is, when the conductive elastic portion 210 is bonded to the functional element 230, even though soldering is difficult, the substrate 220 may provide stable bonding through the conductive adhesive layer or the like.

The functional element 230 is embedded in the substrate 220 to be electrically connected in series to the conductive elastic portion 210. That is, the functional element 230 may be electrically connected in series to the conductive elastic portion 210 through the first conductive via 228 and the first outer electrode 224 of the substrate 220. Here, a function of the functional element 230 is identical to that of the functional element 130 or 130' of the first embodiment, and thus a detailed description thereof will be omitted.

For example, as shown in FIG. 7, the functional element 230 includes the first electrode 226, the second electrode 227, and the second dielectric layer 222.

The first electrode 226 is embedded in the substrate 220 to be electrically connected to the conductive elastic portion 210. That is, the first electrode 226 may be disposed on the dielectric layer 222 to be connected to the conductive elastic portion 210 through the first conductive via 228 and the first outer electrode 224.

The second electrode 227 is embedded in the substrate 220 to be opposite to the first electrode 226. That is, the second electrode 227 may be disposed on the dielectric layer 221 to be connected to the second outer electrode 225 through the second conductive via 228'.

In order to increase capacitance, the first electrode 226 and the second electrode 227 may be formed to be larger than the first outer electrode 224 and the second outer electrode 225, respectively. However, as necessary, the first electrode 226 and the second electrode 227 may be formed to be smaller than the first outer electrode 224 and the second outer electrode 225, respectively.

The first dielectric layer 222 is provided between the first electrode 226 and the second electrode 227. That is, the first dielectric layer 222 may be disposed between the second dielectric layers 221 and 223. The first dielectric layer 222 may have a dielectric constant that is higher than that of each of the second dielectric layers 221 and 223 provided below and on the first dielectric layer 222. For example, the first dielectric layer 222 may be made of FR4, and the second dielectric layers 221 and 223 may each be formed of PI.

Here, in the functional element 230, a dielectric constant of the first dielectric layer 222, a thickness between the first electrode 226 and the second electrode 227, and an area of each of the first electrode 226 and the second electrode 227 may be set such that a withstanding voltage of the functional element 230 is greater than a rated voltage of the external power source of the electronic device, and capacitance is formed to be able to pass a communication signal flowed from a conductor.

The functional element 230 configured as described above may prevent the user from being damaged due to electric shock and the like and prevent damage to the internal circuit through a conductor such as the conductive case. For example, when a leakage current flows from the ground of the circuit substrate of the electronic device, since the withstanding voltage between the first electrode 226 and the second electrode 227 is greater than the rated voltage of the external power source, the functional element 230 may block the leakage current of the external power source instead of allowing the leakage current to flow through the functional element 230.

Further, when a communication signal is flowed from the conductor or the circuit substrate, the functional element 230 may serve as a capacitor to perform a function of transferring the communication signal.

Further, when the ESD flows from the conductor, since a dielectric breakdown voltage between the first electrode 226 and the second electrode 227 is greater than a breakdown voltage therebetween, the functional element 230 may pass the ESD without a dielectric breakdown. The functional element 230 may be configured to pass the ESD to the ground of the circuit substrate, thereby protecting the internal circuit.

As described above, since the functional element 230 is implemented by being embedded in the substrate 220, the functional element 230 may be manufactured using only a simplified substrate forming process as compared with the existing functional element made of a ceramic material such that the functional element 230 may be easily manufactured as well as, when a large-area substrate is used, the functional element 230 may be suitable for mass production. Consequently, a manufacturing cost and a process time can be reduced such that efficiency of a manufacturing process can be improved.

The functional contactor 200 may be manufactured using a large-area substrate. For example, the functional contactor 200 may be formed such that a plurality of first electrodes 226 and second electrodes 227 are formed to be embedded in a large-area substrate 220a to form a plurality of functional elements 230, a plurality of conductive elastic portions 210 are soldered to the large-area substrate 120a, and then the large-area substrate 120a is cut in a unit size.

The manufacturing process of the functional contactor 200 will be described in more detail with reference to FIG. 8.

First, the large-area substrate 220a corresponding to each of the plurality of dielectric layers 221, 222, and 223 may be formed. Here, the plurality of dielectric layers 221, 222, and 223 may be sequentially stacked. That is, the first dielectric layer 222 having the first electrodes 226 may be disposed on the second dielectric layer 221 having the second electrodes 227, and the second dielectric layer 223 having first outer electrodes 224 may be disposed on the first dielectric layer 222. Thus, functional elements 230 may be implemented to be embedded in the substrate 220.

As described above, the functional elements 230 are implemented on the substrates 220 using the large-area substrate 320a such that the functional elements 330 may be easily manufactured and mass-produced. Further, since the functional element 230 is implemented during the formation of the substrate 220, a process may be simplified as compared with a case in which the functional element 230 is coupled to a guide.

Figure 8:
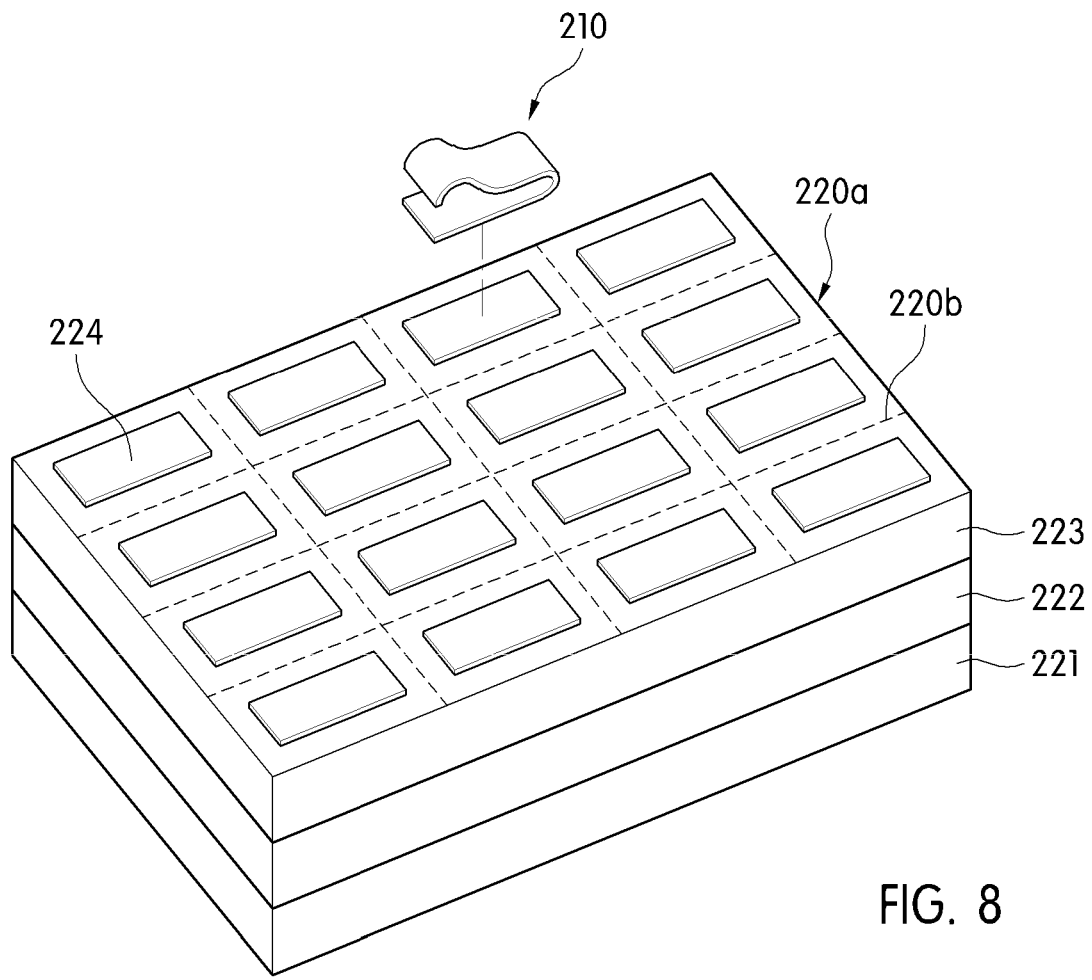
FIG. 8 is a perspective view illustrating a process of soldering conductive elastic portions during a process of manufacturing the functional contactor according to the second embodiment of the present invention.

As shown in FIG. 8, conductive elastic portions 210 may be bonded to the large-area substrate 220a comprised of the plurality of dielectric layers 221, 222, and 223 and having the functional elements 230 embedded therein through soldering.

That is, in a state in which the first outer electrodes 224 are exposed to the outside on an upper surface of the large-area substrate 220a having the functional elements 230 embedded therein, the plurality of conductive elastic portions 210 are soldered to the second outer electrodes 225 using solder such that the conductive elastic portions 210, the substrates 220, and the functional elements 230 may be integrally formed.

As described above, since the plurality of conductive elastic portions 210 are soldered to the plurality of first electrodes 224 on the large-area substrate 220a using solder, an alignment and soldering of the conductive elastic portions 210 may be performed easily and accurately as compared with a conventional individual coupling such that efficiency of a manufacturing process as well as reliability of a product may be improved.

In this case, the large-area substrate 220a is cut along a cutting line 220b having a unit size such that a unit functional contactor 200 may be manufactured in large quantities.

As described above, since the embedding of the functional elements 230 and the soldering of the conductive elastic portions 210 may be carried out simultaneously in large quantities using the large-area substrate 220a, mass production of the functional contactor 200 may be possible.

Meanwhile, in the functional contactor according to the second embodiment of the present invention, the functional element may be variously modified.

Figure 9:
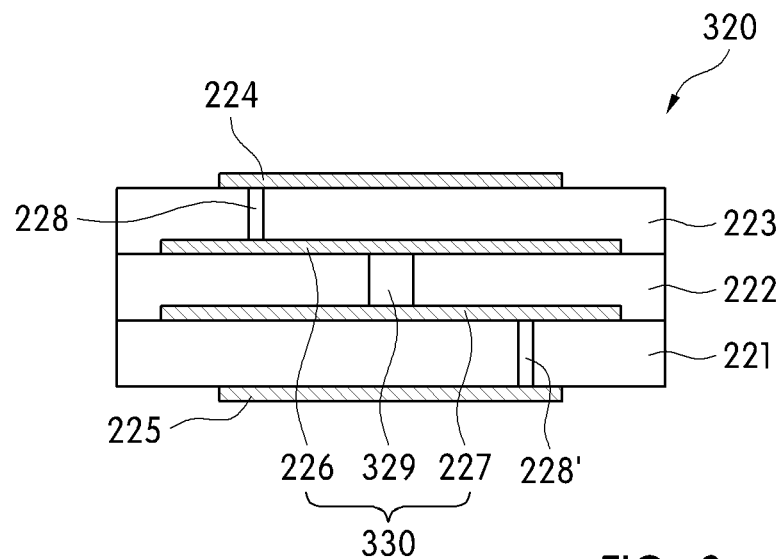
FIG. 9 is a cross-sectional view of another example of the functional contactor according to the second embodiment of the present invention.

FIG. 9 is a diagram schematically illustrating an example in which a functional element 330 is comprised of a suppressor. In the present invention, the functional element 330 may be configured as a part of a substrate 320, and a pore 329 is formed between the first electrode 226 and the second electrode 227.

In this case, an electrical discharge material layer may be formed on a part or an entirety of the pore 329. For example, the pore 329 may be filled with an electrical discharge material layer or the electrical discharge material layer may be applied to or coated on an inner wall of the pore 329. Here, an electrical discharge material constituting the electrical discharge material layer should have a low dielectric constant, low conductivity, and no short circuit when an overvoltage is applied.

To this end, the electrical discharge material may be made of a non-conductive material including at least one kind of metal particles. Alternatively, the electrical discharge material may be made of a semiconductor material containing SiC or a silicon-based component.

For example, when each of the first electrode 226 and the second electrode 227 includes an Ag component, the electrical discharge material may include a SiC—ZnO-based component. Here, although an example of the electrical discharge material has been described as including the SiC—ZnO-based component, the present invention is not limited thereto, and a non-conductive material including a semiconductor material or metal particles suitable as a component constituting the first electrode 226 and the second electrode 227 may be used as the electrical discharge material.

Meanwhile, in the functional contactor according to the second embodiment of the present invention, the electrodes may be variously modified.

Figure 10:
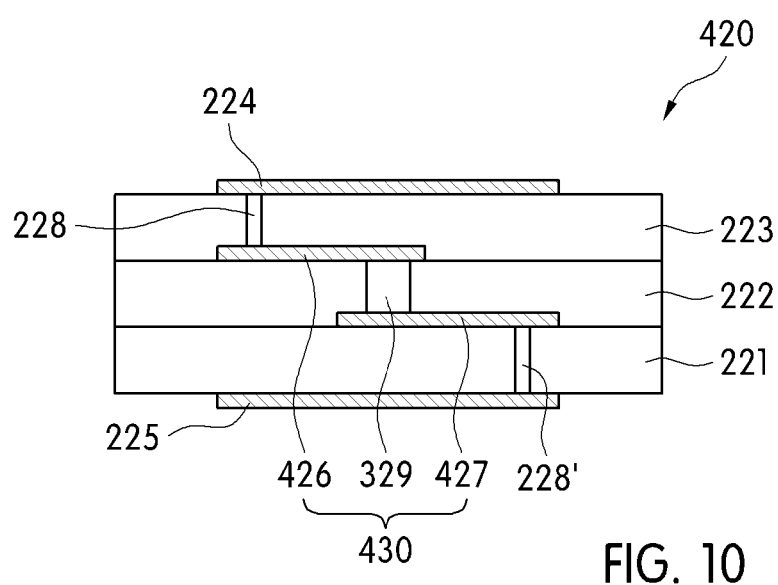
FIG. 10 is a cross-sectional view of still another example of the functional contactor according to the second embodiment of the present invention.

As shown in FIG. 10, in a functional element 430 configured as a part of a substrate 420, a first electrode 426 and a second electrode 427 may be provided to be smaller than the first outer electrode 224 and the second outer electrode 225, respectively.

That is, the first electrode 426 and the second electrode 427 may be formed to have an overlapping area therebetween according to capacitance which will be formed and, particularly, be formed to be smaller than the first outer electrode 224 and the second outer electrode 225, respectively, so that the first electrode 426 and the second electrode 427 only overlap in the vicinity of the pore 329.

When a leakage current flows from the ground of the circuit substrate of the electronic device, since a withstanding voltage between the first electrode 226 or 426 and the second electrode 227 or 427 is greater than a rated voltage of the external power source, the functional element 330 or 430 configured as described above may block the leakage current of the external power source instead of allowing the leakage current to flow through the functional element 330 or 430.

Further, when a communication signal is flowed from the conductor or the circuit substrate, the functional element 330 or 430 may serve as a capacitor to perform a function of transferring the communication signal.

Further, when ESD flows from the conductor, the functional element 330 or 430 may pass the ESD without a dielectric breakdown through the pore 329 between the first electrode 226 or 426 and the second electrode 227 or 427. The functional element 330 or 430 may be configured to pass the ESD to the ground of the circuit substrate, thereby protecting the internal circuit.

Although the exemplary embodiments of the present invention have been described, the spirit of the present invention is not limited to the exemplary embodiments disclosed herein, and it should be understood that numerous other embodiments can be devised by those skilled in the art that will fall within the same spirit and scope of this disclosure through addition, modification, deletion, supplement, and the like of a component, and also these other embodiments will fall within the spirit and scope of the present invention.

The invention claimed is:

1. A functional contactor for an electronic device, the functional contactor comprising:
   a conductive elastic portion configured to come into electrical contact with one among a circuit substrate of the electronic device, a bracket coupled to the circuit substrate, and a conductor contactable with a human body and having elasticity;
   a substrate comprised of a plurality of dielectric layers; and
   a functional element embedded in the substrate to be electrically connected in series to the conductive elastic portion,
   wherein the conductive elastic portion has a shape of a C-shaped clip, and is an in-line contact or an in-point contact and is configured to reduce galvanic corrosion,
   wherein the substrate serves as a guide which acts as a medium for fixing the conductive elastic portion and the functional element,
   wherein the substrate comprises a cavity, the functional element is embedded inside the cavity, and the cavity is vertically formed to pass through one of the plurality of dielectric layers,
   wherein the functional element comprises functional element-outer electrodes provided at two opposite ends of the functional element, and wherein the functional element-outer electrodes are provided on and below the functional element.

2. The functional contactor of claim 1, wherein the substrate includes:
   a first outer electrode provided below the plurality of dielectric layers;
   a second outer electrode provided on the plurality of dielectric layers and connected to the conductive elastic portion;
   a first connection electrode connected to the first outer electrode through a first conductive via; and
   a second connection electrode connected to the second outer electrode through a second conductive via.

3. The functional contactor of claim 2, wherein the functional element-outer electrodes are connected to the first connection electrode and the second connection electrode on both sides of the cavity.

4. The functional contactor of claim 1, wherein the functional element has at least one among an electric shock prevention function of blocking a leakage current of an external power source flowing from a ground of the circuit substrate of the electronic device, a communication signal transfer function of passing a communication signal flowed from a conductive case or the circuit substrate, and an electrostatic discharge (ESD) protection function of passing an ESD without a dielectric breakdown when the ESD flows from the conductive case.

5. A functional contactor for an electronic device, the functional contactor comprising:
   a conductive elastic portion configured to come into electrical contact with one among a circuit substrate of the electronic device, a bracket coupled to the circuit substrate, and a conductor contactable with a human body and having elasticity;
   a substrate comprised of a plurality of dielectric layers; and
   a functional element including a first electrode embedded in the substrate so as to be electrically connected in series to the conductive elastic portion, and a second electrode embedded in the substrate to be opposite to the first electrode,
   wherein the conductive elastic portion has a shape of a C-shaped clip, and is an in-line contact or an in-point contact and is configured to reduce galvanic corrosion,
   wherein the substrate serves as a guide which acts as a medium for fixing the conductive elastic portion and the functional element,
   wherein the plurality of dielectric layers comprises a first dielectric layer disposed between the first electrode and the second electrode, and a plurality of second dielectric layers disposed independently on the first electrode or below the second electrode, and
   wherein the first dielectric layer has a dielectric constant that is higher than that of each of the plurality of second dielectric layers, and the first dielectric layer is comprised of frame retardant 4 (FR4), and each of the plurality of the second dielectric layers is comprised of polyimide (PI).

6. The functional contactor of claim 5, wherein the substrate includes:
   a first outer electrode provided on the plurality of dielectric layers;
   a second outer electrode provided below the plurality of dielectric layers and connected to the conductive elastic portion;

a first conductive via configured to connect the first outer electrode to the first electrode; and a second conductive via configured to connect the second outer electrode to the second electrode.

7. The functional contactor of claim 5, wherein the functional element further includes a pore formed between the first electrode and the second electrode.

8. The functional contactor of claim 7, wherein an electrical discharge material layer is formed in a part or an entirety of the pore.

9. The functional contactor of claim 5, wherein the functional element has at least one among an electric shock prevention function of blocking a leakage current of an external power source flowing from a ground of the circuit substrate of the electronic device, a communication signal transfer function of passing a communication signal flowed from a conductive case or the circuit substrate, and an electrostatic discharge (ESD) protection function of passing an ESD without a dielectric breakdown when the ESD flows from the conductive case.

* * * * *